United States Patent
Ohkawa

(10) Patent No.: US 11,661,655 B2
(45) Date of Patent: May 30, 2023

(54) METALORGANIC CHEMICAL VAPOR DEPOSITION SYSTEM AND METHOD

(71) Applicant: KING ABDULLAH UNIVERSITY OF SCIENCE AND TECHNOLOGY, Thuwal (SA)

(72) Inventor: Kazuhiro Ohkawa, Thuwal (SA)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 200 days.

(21) Appl. No.: 16/621,845

(22) PCT Filed: Jun. 8, 2018

(86) PCT No.: PCT/IB2018/054173
§ 371 (c)(1),
(2) Date: Dec. 12, 2019

(87) PCT Pub. No.: WO2019/012344
PCT Pub. Date: Jan. 17, 2019

(65) Prior Publication Data
US 2020/0115800 A1    Apr. 16, 2020

Related U.S. Application Data

(60) Provisional application No. 62/627,930, filed on Feb. 8, 2018, provisional application No. 62/532,451, filed on Jul. 14, 2017.

(51) Int. Cl.
*C23C 16/46*    (2006.01)
*C23C 16/30*    (2006.01)
(Continued)

(52) U.S. Cl.
CPC ............ *C23C 16/46* (2013.01); *C23C 16/303* (2013.01); *H01L 21/0254* (2013.01);
(Continued)

(58) Field of Classification Search
CPC ... C23C 16/46; C23C 16/303; H01L 21/0262; H01L 21/67109; H01L 33/007
See application file for complete search history.

(56) References Cited

U.S. PATENT DOCUMENTS 4,836,138 A    6/1989  Robinson et al.
5,203,925 A *  4/1993  Shibuya ............. C23C 16/4481
                                                           118/724
(Continued)

FOREIGN PATENT DOCUMENTS

JP    2014022500 A    2/2014

OTHER PUBLICATIONS

International Search Report in corresponding/related International Application No. PCT/IB2018/054173, dated Nov. 26, 2018.
(Continued)

*Primary Examiner* — Dale E Page
*Assistant Examiner* — Quovaunda Jefferson
(74) *Attorney, Agent, or Firm* — Patent Portfolio Builders PLLC

(57) ABSTRACT

A metal organic chemical vapor deposition system includes a reaction chamber, a first heater arranged on a first side of the reaction chamber, and a second heater arranged on a second side of the reaction chamber. A controller is configured to selectively control an amount of heat applied by the second heater to the reaction chamber depending on a type of vapor deposition being performed in the reaction chamber.

17 Claims, 6 Drawing Sheets

(51) Int. Cl.
   *H01L 21/02* (2006.01)
   *H01L 21/67* (2006.01)
   *H01L 33/00* (2010.01)

(52) U.S. Cl.
   CPC .... *H01L 21/0262* (2013.01); *H01L 21/67109* (2013.01); *H01L 33/007* (2013.01)

(56) References Cited

U.S. PATENT DOCUMENTS

| | | |
|---|---|---|
| 2002/0157611 A1 | 10/2002 | Bondestam et al. |
| 2010/0093124 A1 | 4/2010 | Koukitu et al. |
| 2011/0155061 A1* | 6/2011 | Chen ........................ C23C 16/46 118/725 |

OTHER PUBLICATIONS

Written Opinion of the International Searching Authority in corresponding/related International Application No. PCT/B2018/054173, dated Nov. 26, 2018.

* cited by examiner

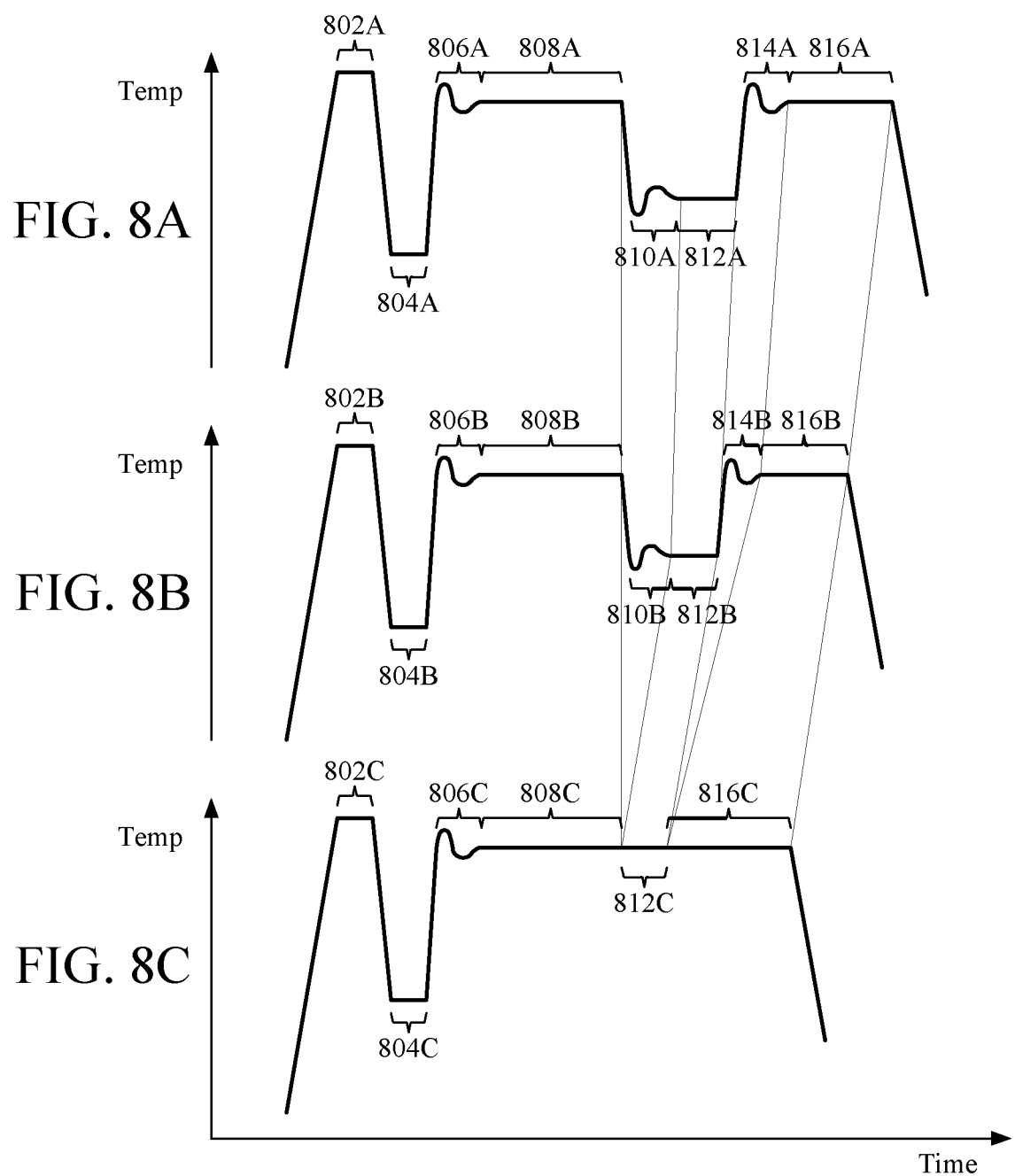

METALORGANIC CHEMICAL VAPOR DEPOSITION SYSTEM AND METHOD

CROSS-REFERENCE TO RELATED APPLICATIONS

This application is a U.S. National Stage Application of International Application No. PCT/IB2018/054173, filed on Jun. 8, 2018, which claims priority and benefit to U.S. Provisional Patent Application No. 62/532,451, filed on Jul. 14, 2017, entitled "Metalorganic Chemical Vapor Deposition System of Nitride Semiconductors" and U.S. Provisional Patent Application No. 62/627,930, filed on Feb. 8, 2018, entitled "Metalorganic Chemical Vapor Deposition System and Method," the disclosures of which are incorporated herein by reference in their entirety.

BACKGROUND

Technical Field

Embodiments of the subject matter disclosed herein generally relate to a metal organic chemical vapor deposition system and a method of operating a metal organic chemical vapor deposition system.

Discussion of the Background

Metal organic chemical vapor deposition (MOCVD) systems are used to form a variety of nitride semiconductor-based devices, such as light emitting diodes (LEDs), lasers, as well as other electronic devices. FIG. 1 illustrates a cross-sectional view of an LED 100 formed using a metal organic chemical vapor deposition system. The LED 100 includes a substrate 102, such as sapphire, on top of which a number of successive layers are formed using chemical deposition in a MOCVD system. Specifically, an n-type layer 104 is formed on the substrate 102, an indium gallium nitride (InGaN) layer 106 is formed on n-type layer 104, a p-type layer 108 is formed on the InGaN layer 106, and an indium tin oxide (ITO) layer 110 is formed on the p-type layer 108. The n-type layer 104 and p-type layer 108 can be formed from gallium nitride (GaN) or aluminum gallium nitride (AlGaN). An n-contact 112 is formed on the n-type layer 104 and a p-contact 114 is formed on the indium tin oxide layer 110 as electrical contacts for the LED 100. Layers 104-108 are formed within the metal organic chemical vapor deposition system and electrodes 110, 112, and 114 can be formed using a separate process, such as using an electron beam evaporator. As an alternative to layer 106 being an indium gallium nitride layer, layer 106 can be an indium aluminum nitride (InAlN) or indium aluminum gallium nitride (InAlGaN) layer.

Layers 104-110 are formed by flowing vapor into a metal organic chemical vapor deposition system, an example of which is illustrated in FIG. 2. The system 200 includes a reaction chamber 202 (denoted by the dashed lines) into which vapors 204 (symbolically represented by the arrow) are supplied. Quartz tubes are typically employed to form the reaction chamber. The reaction chamber 202 is surrounded by a quartz tube including a top portion 206A and bottom portion 206B. An outer protective tube 208 surrounds the reaction chamber 202 and the quartz tube, including top and bottom portions 206A and 206B. Water is arranged between the outer protective tube 208 and the quartz tube to cool the device. A radio frequency coil 210 surrounds the outer protective tube 208. An inductive heater 212, which includes an area 214 to accommodate a substrate, is arranged in the lower portion of the quartz tube 206B.

The operation of the metal organic chemical vapor deposition system 200 will now be described in connection with FIG. 3. Initially, a substrate is arranged in the area 214 of heater 212, and then the heater 212 is activated by pulsing radio frequency coil 210. The pulsing of the radio frequency coil 210 is controlled so that heater 212 reaches a temperature to perform a thermal cleaning of the substrate for a time period 302 using vapors supplied to the reaction chamber 202. The pulsing of the radio frequency coil 210 is then controlled to lower the temperature of the substrate 214 to the temperature for supplying a low-temperature (LT) buffer for a time period 304.

The pulsing of the radio frequency coil 210 is then controlled to raise the temperature of the substrate 214 to the temperature for forming the n-type layer 104 while the vapors for the n-type layer 104 are supplied to the reaction chamber during a time period 308. As illustrated by the curvy portions 306 preceding the relatively flat temperature during time period 308, the changing of the substrate temperature from one for applying the low-temperature buffer to one for forming the n-type layer 104 typically varies until it settles on the proper temperature for forming the n-type layer 104.

The pulsing of the radio frequency coil 210 is then controlled to lower the temperature of the substrate 214 to the temperature for forming the indium gallium nitride layer 106 while the vapors for the indium gallium nitride layer 106 are supplied to the reaction chamber during a time period 312. Again, as indicated by time period 310, there will be a period of time before the substrate 214 settles at the proper temperature for forming layer 106.

The pulsing of the radio frequency coil 210 is then controlled to raise the temperature of the substrate 214 to the temperature for forming the p-type layer 108 while the vapors for the p-type layer 108 are supplied to the reaction chamber during a time period 316. As indicated by time period 314, there will be a period of time before the substrate 214 settles at the proper temperature for forming layer 108. The temperature is then allowed to fall until the p-type layer 108 grows to the required thickness.

As will be appreciated by those skilled in the art, it is desirable to form each of these layers at higher temperatures to reduce the amount of crystal defects formed in the layer. However, it is not possible to form the indium gallium nitride layer 106 at the same high temperature used for forming the n-type 104 and p-type 108 layers, which are comprised of gallium nitride or aluminum gallium nitride, because in conventional metal organic chemical vapor deposition systems this high temperature results in most of the indium supplied to the chamber 202 breaking down and not being deposited as part of the layer. Accordingly, the n-type 104 and p-type 108 layers are typically formed in the temperature range of 900-1100° C. and the indium gallium nitride layer 106 is typically formed in the temperature range of 720-820° C. This relatively low temperature used to form the indium gallium nitride layer 108 produces a layer with a significant number of crystal defects, which affects the performance of the LED 100.

Further, as denoted by time periods 310 and 314, lowering the temperature from the n-type layer 104 forming temperature to the indium gallium nitride layer 106 forming temperature and then raising it again to the temperature for the p-type layer 108 forming temperature lengthens the overall time required to produce the device because the substrate temperature needs to stabilize at the desired temperature before the vapor for a particular layer can be supplied to the reaction chamber 202.

Thus, there is a need for a metal organic chemical vapor deposition system that can form an electronic device at temperatures that produces fewer crystal defects than in conventional systems. There is also a need for a metal organic chemical vapor deposition system that can reduce the overall time required to form a device.

SUMMARY

According to an embodiment, there is metal organic chemical vapor deposition system, which includes a reaction chamber, a first heater arranged on a first side of the reaction chamber, and a second heater arranged on a second side of the reaction chamber. A controller is configured to selectively control an amount of heat applied by the second heater to the reaction chamber depending on a type of vapor deposition being performed in the reaction chamber.

According to another embodiment, there is a method of operating a metal organic chemical vapor deposition system. A reaction chamber is heated using a first heater arranged on a first side of the reaction chamber during a first type of vapor deposition. It is determined that a second type of vapor deposition will be performed in the reaction chamber. The reaction chamber is heated using the first heater and a second heater, which is arranged on a second side of the reaction chamber, responsive to the determination that the second type of vapor deposition will be perform in the reaction chamber and while the second type of vapor deposition is performed.

According to a further embodiment, there is a method of operating a metal organic chemical vapor deposition system. A reaction chamber of the metal organic chemical vapor deposition system is heated during a first time period using a first heater while a first type of semiconductor vapor is supplied to the reaction chamber. Subsequent to the first period of time, an amount of heat supplied to the reaction chamber by the second heater is adjusted to a first amount of heat. During a second period of time and while the second heater is generating the first amount of heat, the reaction chamber is heated using the first and second heaters while a second type of semiconductor vapor is supplied to the reaction chamber. Subsequent to the second period of time, an amount of heat supplied to the reaction chamber by the second heater is adjusted to a second amount of heat. During a third period of time and while the second heater is generating the second amount of heat, the reaction chamber is heated while a third type of semiconductor vapor is supplied to the reaction chamber.

BRIEF DESCRIPTION OF THE DRAWINGS

The accompanying drawings, which are incorporated in and constitute a part of the specification, illustrate one or more embodiments and, together with the description, explain these embodiments. In the drawings:

FIGS. 8A-8C are graphs illustrating relative temperatures in a reaction chamber of a conventional and the inventive metal organic chemical vapor deposition systems.

DETAILED DESCRIPTION

The following description of the exemplary embodiments refers to the accompanying drawings. The same reference numbers in different drawings identify the same or similar elements. The following detailed description does not limit the invention. Instead, the scope of the invention is defined by the appended claims. The following embodiments are discussed, for simplicity, with regard to the terminology and structure of metal organic chemical vapor deposition system.

Reference throughout the specification to "one embodiment" or "an embodiment" means that a particular feature, structure or characteristic described in connection with an embodiment is included in at least one embodiment of the subject matter disclosed. Thus, the appearance of the phrases "in one embodiment" or "in an embodiment" in various places throughout the specification is not necessarily referring to the same embodiment. Further, the particular features, structures or characteristics may be combined in any suitable manner in one or more embodiments.

Figure 4:
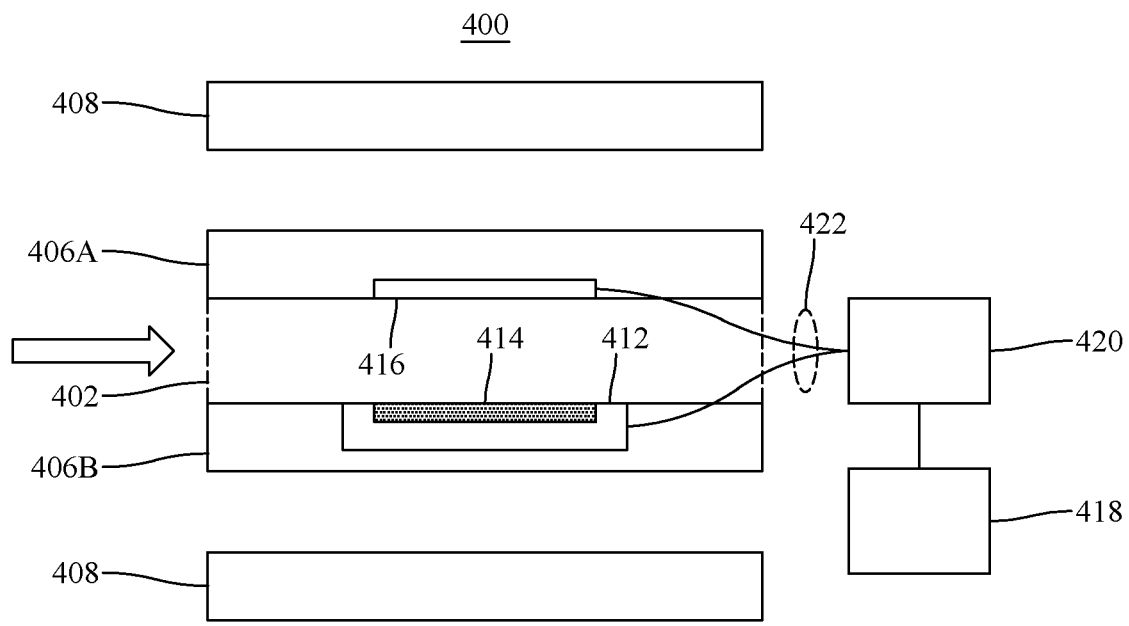
FIG. 4 is a cross-sectional schematic diagram of a metal organic chemical vapor deposition system according to an embodiment.

FIG. 4 is a cross-sectional schematic diagram of a metal organic chemical vapor deposition system according to an embodiment. The system 400 includes a reaction chamber 402, a first heater 412 arranged on a first side of the reaction chamber 402, a second heater 416 arranged on a second side of the reaction chamber, and a controller 418. The controller 418 is configured to selectively control an amount of heat applied by the second heater 416 to the reaction chamber 402 depending on a type of vapor deposition being performed in the reaction chamber 402.

The controller 418 can be any type of controller, including a special-purpose controller, a microprocessor, a field programmable gate array (FPGA), application specific integrated circuit (ASIC), or the like. When the controller 418 is a microprocessor, the controller also includes a non-transitory memory storing computer-readable instructions for the microprocessor to perform the control disclosed herein.

In this embodiment, the first 412 and second 416 heaters are resistive heaters. Accordingly, the controller 418 is coupled to a power source 420 to control the amount of power applied to the first 412 and second 416 heaters via electrical couplings 422. Similar to the conventional metal organic chemical vapor deposition system, the system 400 includes a quartz tube, having a top portion 406A and bottom portion 406B, surrounding the reaction chamber 402, an area 214 in the first heater 412 to accommodate a substrate, an outer protective tube 408, and water arranged between the outer protective tube 408 and the quartz tube.

Figure 5:
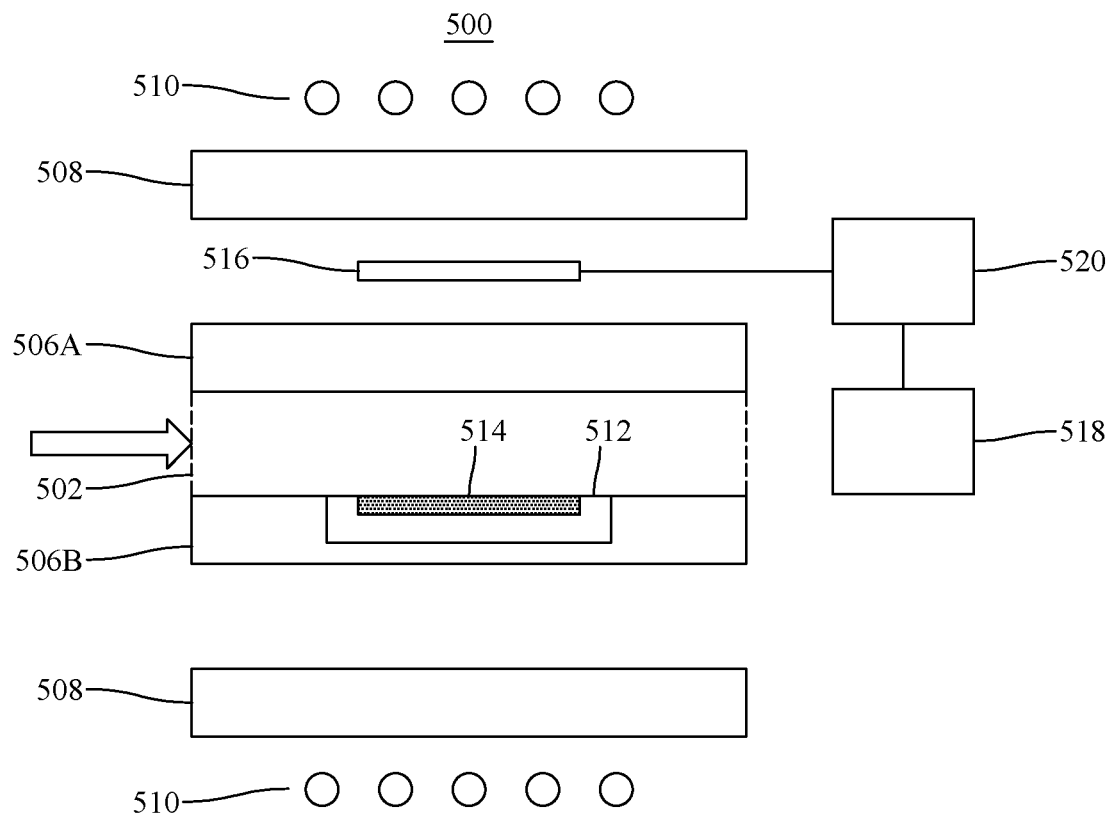
FIG. 5 is a cross-sectional schematic diagram of a metal organic chemical vapor deposition system according to an embodiment.

FIG. 5 is a cross-sectional schematic diagram of a metal organic chemical vapor deposition system according to an embodiment. In contrast to the use of resistive heaters 412 and 416 in the metal organic chemical vapor deposition system 400 in FIG. 4, the metal organic chemical vapor deposition system 500 in FIG. 5 employs inductive heaters 512 and 516. Specifically, the system 500 includes a reaction chamber 502, a first heater 512 arranged on a first side of the reaction chamber 502, a second heater 516 arranged on a second side of the reaction chamber, and a controller 518. The controller 518 is configured to selectively control an amount of heat applied by the second heater 516 to the reaction chamber 502 depending on a type of vapor deposition being performed in the reaction chamber 502.

The first 512 and second 516 inductive heaters can be carbon-based heaters. The controller 518 can be any type of controller, including a special-purpose controller, a microprocessor, a field programmable gate array (FPGA), application specific integrated circuit (ASIC), or the like. When the controller 518 is a microprocessor, the controller also includes a non-transitory memory storing computer-readable instructions for the microprocessor to perform the control disclosed herein.

The selective control of the amount of heat applied by the second heater 516 is achieved by the controller 518 adjusting a relative position of the second heater 516 to the top portion of the quartz tube 506A using motor 520. Thus, as the distance between the second heater 516 and the top portion of the quartz tube 506A increases, the amount of heat generated by the second heater 516, when activated by the radio frequency coil 510, affecting the vapor in the reaction chamber 502 decreases. Similarly, as the distance between the second heater 516 and the top portion of the quartz tube 506A decreases, the amount of heat generated by the second heater 516, when activated by the radio frequency coil 510, affecting the vapor in the reaction chamber 502 increases.

Similar to the conventional metal organic chemical vapor deposition system, the system 500 includes a quartz tube, having a top portion 506A and bottom portion 506B, surrounding the reaction chamber 502, an area 514 in the first heater 512 to accommodate a substrate, an outer protective tube 508, and water arranged between the outer protective tube 508 and the quartz tube.

The second heaters 416 and 516 in FIGS. 4 and 5 are used to enhance thermal decomposition of molecules in the reaction chamber by changing a flow of the molecules in the reaction chamber so that the molecules are directed towards the substrate 414 or 514, which will be described in more detail in connection with FIGS. 6A-6C. The second heaters 416 and 516 can be the same size as the first heaters 412 and 512, respectively, or can be smaller than the first heaters 412 and 512, respectively. Even when the second heater 416 or 516 is smaller than the first heater 412 or 512, the smaller heater can still change the flow of molecules in the reaction chamber so that the molecules are directed towards the substrate 414 or 514. Further, although only a single second heater 416 or 516 are illustrated in FIGS. 4 and 5, more than one second heater 416 or 516 can be employed.

Figure 6A:
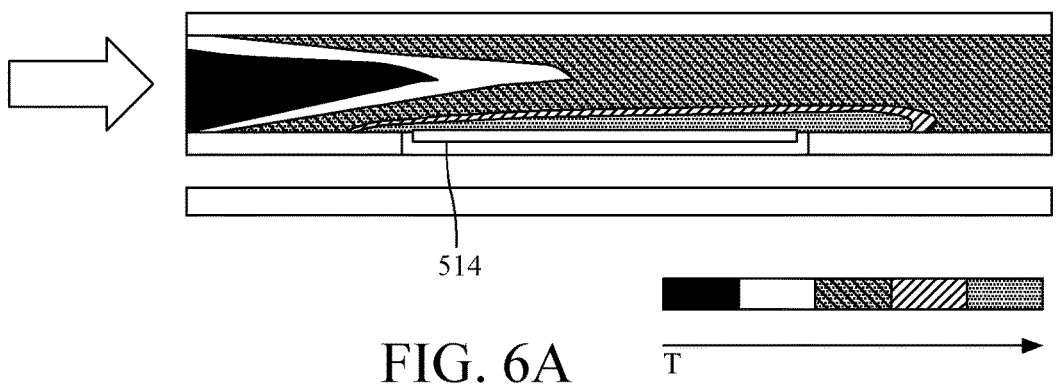
FIG. 6A is a cross-sectional schematic diagram of the temperature distribution within a reaction chamber in a conventional metal organic chemical vapor deposition system.
Figure 6B:
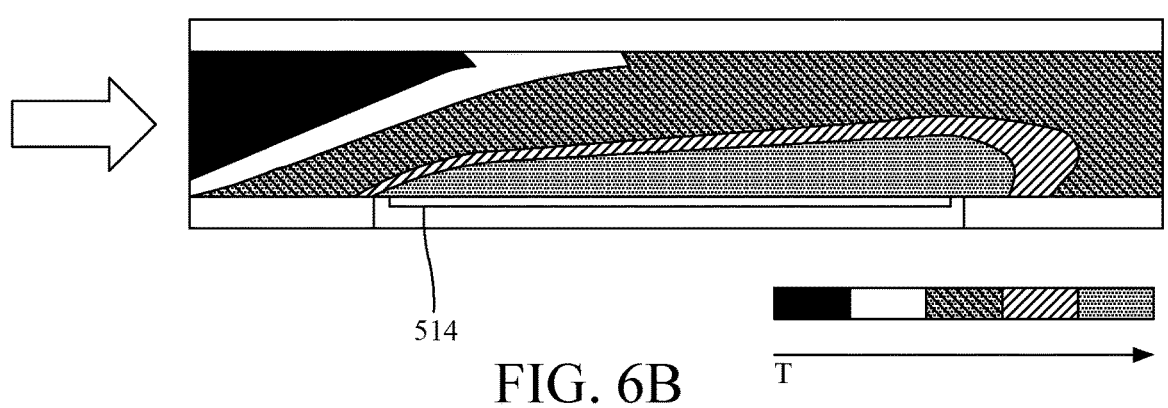
FIG. 6B is a cross-sectional schematic diagram of the temperature distribution within a reaction chamber in a metal organic chemical vapor deposition system according to an embodiment.
Figure 6C:
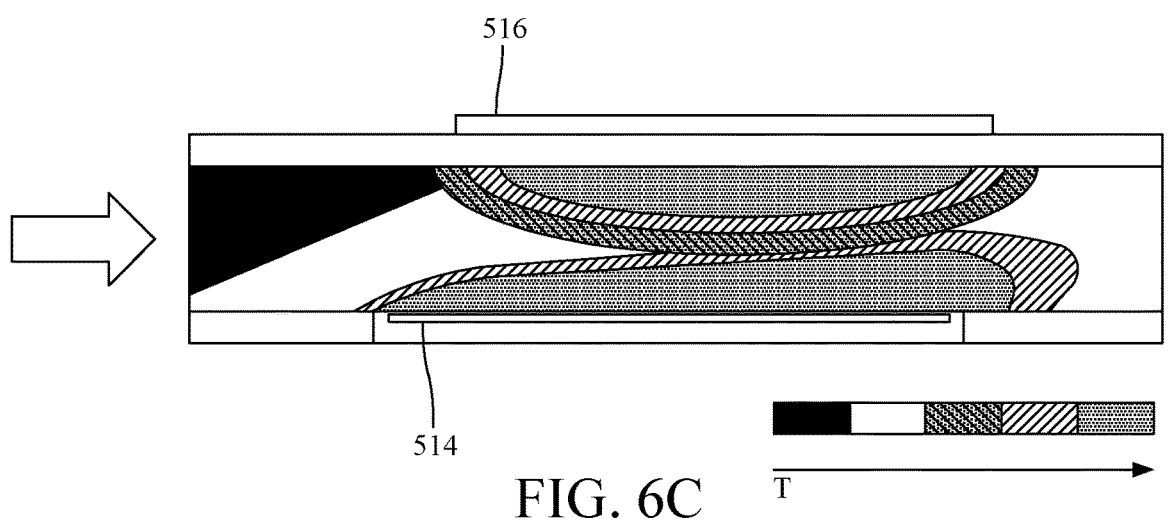
FIG. 6C is a cross-sectional schematic diagram of the temperature distribution within a reaction chamber in a metal organic chemical vapor deposition system according to an embodiment.

FIG. 6A is a cross-sectional schematic diagram of the temperature distribution within a reaction chamber in a conventional metal organic chemical vapor deposition system and FIGS. 6B and 6C are cross-sectional schematic diagrams of the temperature distribution within a reaction chamber in a conventional metal organic chemical vapor deposition system according to an embodiment. The "T" label on the legend of these figures indicates an increasing temperature, e.g., black areas are cooler than white areas.

FIG. 6A is a cross-sectional schematic diagram of the temperature distribution within a reaction chamber in a conventional metal organic chemical vapor deposition system. As illustrated, the heat generated by the single heater in a conventional system is localized around the heater and quickly dissipates as the distance from the heater increases.

FIGS. 6B and 6C are cross-sectional schematic diagrams of the temperature distribution within a reaction chamber in a metal organic chemical vapor deposition system according to an embodiment, with FIG. 6B illustrating the second heater being further away from the reaction chamber and FIG. 6C illustrating the second heater contacting the upper portion of the quartz tube. As will be appreciated by comparing FIGS. 6B and 6C, the closer the second heater comes to the reaction chamber the more heat that is applied to the vapors in the reaction chamber. More significantly, this additional heat affects the flow of the vapor towards the lower portion of the quartz tube 406B or 506B and the substrate 414 or 514. This change in the flow of the vapor allows for indium gallium nitride vapor to be applied at a higher temperature than in the conventional system because the indium gallium nitride vapor is directed towards the substrate 414 or 514 in the lower portion of the quartz tube 406B or 506B, and thus the indium gallium nitride vapor does not evaporate but instead condenses towards the substrate 414 or 514.

FIGS. 6B and 6C illustrate metal organic chemical vapor deposition systems having inductive heaters for the first and second heaters and accordingly the pulsing of the radio frequency coil will activate the second heater regardless of whether not it is touching the top portion of the quartz tube. Thus, as would be appreciated by a comparison of the conventional system in FIG. 6A and the system with a second heater in FIG. 6B, when the radio frequency coil is pulsed, the second heater still affects the temperature distribution within the reaction chamber, as well as the flow of the vapor because at least some of the heat generated by the second heater will radiate into the upper portion of the reaction chamber.

Although FIGS. 6B and 6C illustrate the temperature distribution using inductive first and second heaters, a similar temperature distribution can be achieved using the resistive heaters 412 and 416 described above. Instead of changing the relative position between the second heater and the reaction chamber as illustrated in FIGS. 6B and 6C, the amount of power provided to the resistive heater 416 is changed, i.e., to achieve the temperature distribution in FIG. 6B, a lower amount of power (or no power) is supplied to the second heater 416 and to achieve the temperature distribution in FIG. 6C, a greater amount of power is supplied to the second heater 416 compared to the amount of power supplied to achieve the temperature distribution in FIG. 6B.

Figure 7:
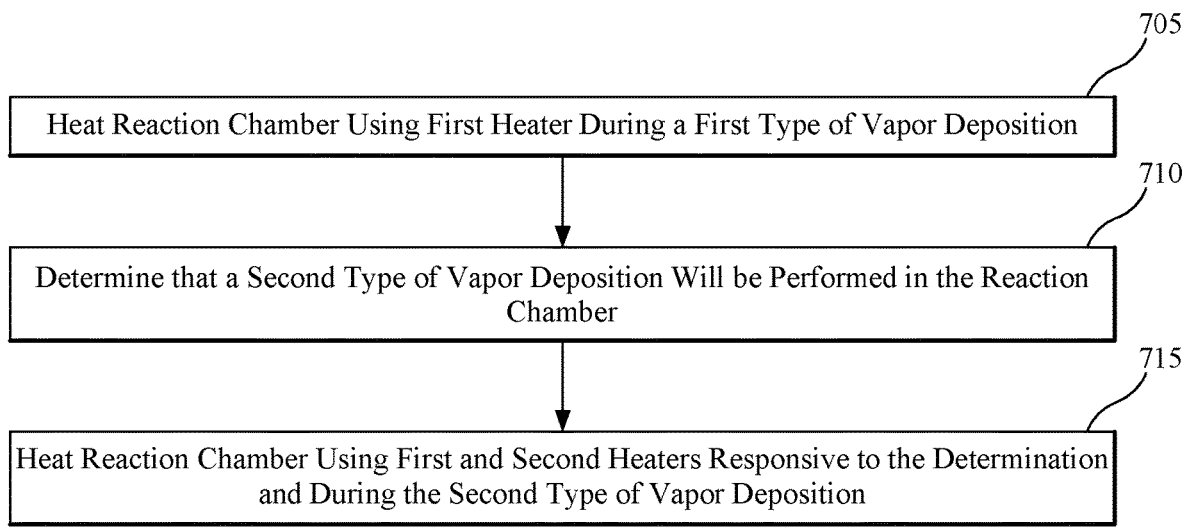
FIG. 7 is a flowchart of a method of operating a metal organic chemical vapor deposition system according to an embodiment.

A method of operating the metal organic chemical vapor deposition systems 400 and 500 will now be described in connection with the flowchart of FIG. 7. Initially, the reaction chamber 402 or 502 is heated using the first heater 412 or 512 during a first type of vapor deposition (step 705). The first type of vapor deposition can be the deposition of gallium nitride or aluminum gallium nitride vapors. The controller 418 or 518 then determines that a second type of vapor deposition will be performed in the reaction chamber 402 or 502 (step 710). The second type of vapor deposition can be the deposition of indium gallium nitride vapors. Responsive to this determination, the controller 418 or 518 then controls the first heater 412 or 512 and the second heater 416 or 516 to heat the reaction chamber 402 or 502 during the second type of vapor deposition (step 715).

Figure 1:
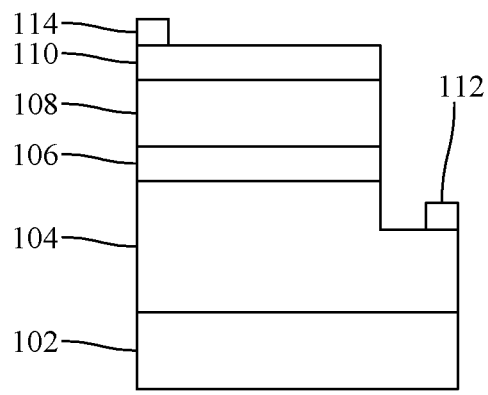
FIG. 1 is a cross-sectional schematic diagram of an electronic device formed using metal organic chemical vapor deposition.
Figure 2:
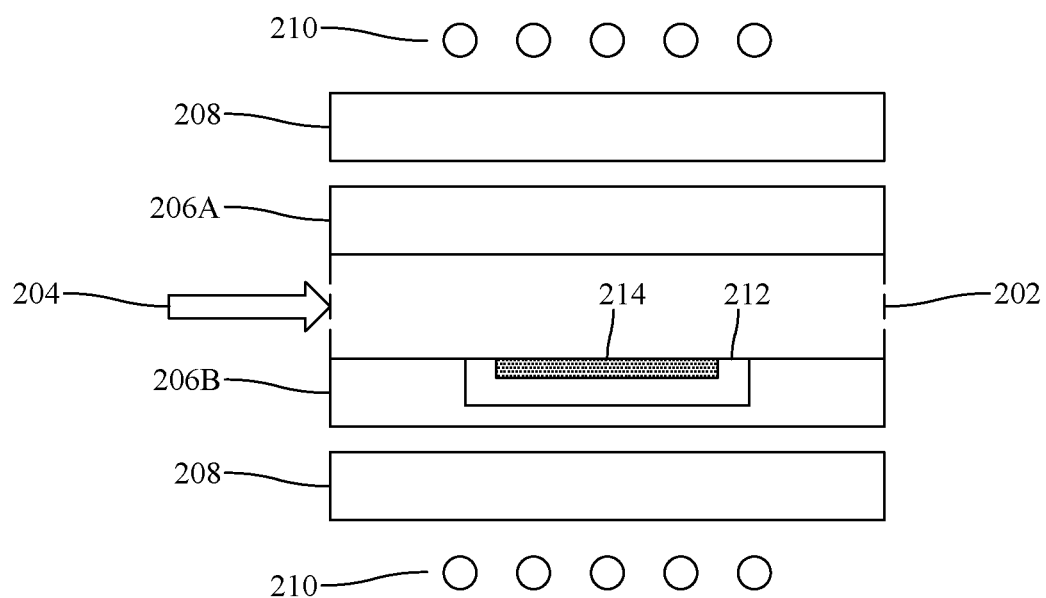
FIG. 2 is a cross-sectional schematic diagram of a conventional metal organic chemical vapor deposition system.
Figure 3:
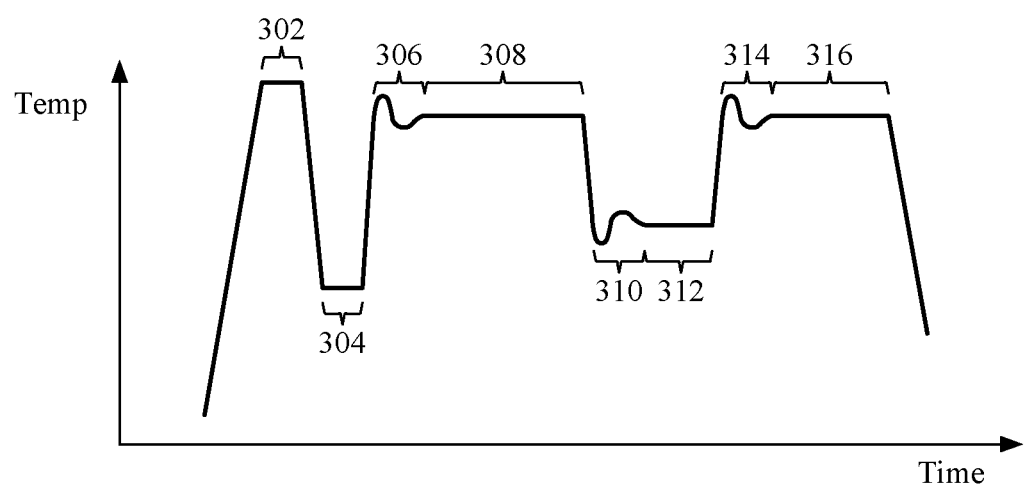
FIG. 3 is a graph of relative temperatures in a reaction chamber of a conventional metal organic chemical vapor deposition system while forming an electronic device.

FIGS. 8A-8C are graphs illustrating relative temperatures in a reaction chamber of a conventional and the inventive metal organic chemical vapor deposition systems. Specifically, FIG. 8A is a graph illustrating relative temperatures of a conventional metal organic chemical vapor deposition system (and is the same as FIG. 3) and FIGS. 8B and 8C are graphs illustrating relative temperatures of metal organic chemical vapor deposition systems having a second heater according to embodiments. In the graph of FIG. 8B the second heater is employed but the temperature in the reaction chamber is lowered during the deposition of the indium gallium nitride layer compared to the temperature used to form the n-type layer; however, the temperature is not lowered as much as in the conventional system that produced the graph of FIG. 8A. In the graph of FIG. 8C the second heater is employed to maintain the same temperature in the reaction chamber for the formation of the n-type layer, the indium gallium nitride layer, and the p-type layer.

As will be appreciated by comparing FIG. 8A with FIGS. 8B and 8C, the overall time to form the n-type layer, indium gallium nitride layer, and p-type layer is shorter using the second heater compared to the single heater used to produce the graph FIG. 8A. In the implementation that produced the graph of FIG. 8B, this decreased time arises due to the temperature used to form the indium gallium nitride layer being higher than that in the conventional system reflected in the graph of FIG. 8A. Thus, the temperature stabilization times periods 810B and 814B in the implementation that produced the graph of FIG. 8B are shorter than the temperature stabilization times 810A and 814A in the conventional system reflected in the graph of FIG. 8A.

In the implementation that produced the graph of FIG. 8C, this decreased time arises due to the use of the second heater to produce the same temperature in the reaction chamber during the formation of the indium gallium nitride layer as used for formation of the n-type and p-type layers, which eliminates the temperature stabilization time periods between the formations of these layers. It should be noted that the second heater affects the flow of vapor during deposition to allow the use of higher temperatures during the formation of the indium gallium nitride layer but the time periods for forming the indium nitride layer (excluding the temperature stabilization times) will be the same between the conventional system that produces the graph of FIG. 8A and the systems employing two heaters that produce the graphs of FIGS. 8B and 8C.

Thus, using the second heater in a metal organic chemical vapor deposition system not only reduces crystal defects during the formation of the indium gallium nitride layer due to the use of higher temperatures than in a conventional system but also reduces the overall time to form the n-type, indium gallium nitride, and p-type layers.

Figure 9:
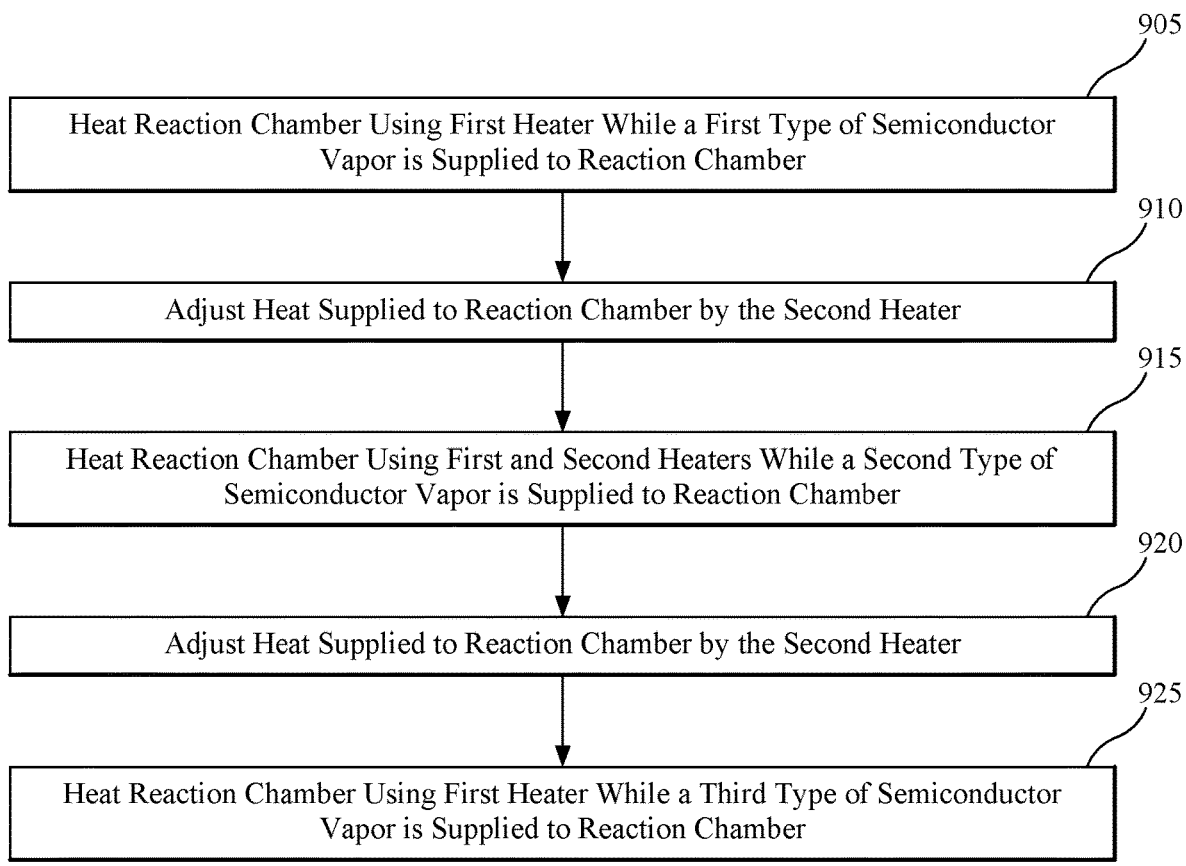
FIG. 9 is a flowchart of a method of operating a metal organic chemical vapor deposition system according to an embodiment.

A method of operating a metal organic chemical vapor deposition system will now be described in connection with the schematic diagrams of FIGS. 4 and 5, the graphs of FIGS. 8B, 8C, and the flowchart of FIG. 9.

Initially, the reaction chamber 402 or 502 is heated using the first heater 412 or 512 while a first type of semiconductor vapor is supplied to the reaction chamber 402 or 502 (step 905). This first type of vapor is the vapor used to form the n-type layer and this step corresponds to time period 808B or 808C. The heat supplied by the second heater 416 or 516 is then adjusted (step 910). In the resistive heater embodiment, this involves providing power to the second heater 416. In the inductive heater embodiment, this involves moving the second heater 516 closer to the reaction chamber 502.

It should be recognized that in the implementation that produces the graph of FIG. 8C, although there is no temperature change between the formation of the n-type layer and the subsequent formation of the indium gallium nitride layer, the temperature of the second heater is still adjusted to affect the vapor flow during deposition. In the resistive heater embodiment, this may involve lowering the temperature produced by the first heater 412 when the temperature of the second heater 416 is raised (or activated if the second heater is not activated during the deposition of the n-type layer vapor). In the inductive heater embodiment, this may involve reducing the energy produced by the radio frequency coil 510 so that when the second heater is moved closer to the reaction chamber 502, the combined temperature produced by the first 512 and second 516 heaters is the desired temperature for the indium gallium nitride vapor deposition.

The reaction chamber is then heated using the first and second heaters while a second type of semiconductor vapor is supplied to the reaction chamber 402 or 502 (step 915). This second type of vapor is the vapor used to form the indium gallium nitride layer and this step corresponds to time period 812B or 812C.

The heat supplied to the reaction chamber 402 or 502 by the second heater 416 or 516 is then adjusted so that the heat produced by the first heater 412 or 512 produces the necessary temperature for the formation of the p-type layer (step 920). In the resistive heater embodiment, this involves not powering the second heater 416. In the inductive heater embodiment, this involves moving the second heater 516 further away from the reaction chamber 502. In an implementation that produces the graph of FIG. 8C, the heat supplied by the second heater 416 or 516 is reduced or eliminated and the heat supplied by the first heater 412 or 512 is increased to reach the desired temperature for the p-type layer vapor deposition.

The reaction chamber 402 or 502 is then heated using the first heater 412 or 512 while a third type of semiconductor vapor is supplied to the reaction chamber 925 (step 925). The third type of vapor is the vapor used to form the p-type layer and this step corresponds to time period 8168 or 816C.

The disclosed embodiments provide a metal organic chemical vapor deposition system and method of operating a metal organic chemical vapor deposition system. It should be understood that this description is not intended to limit the invention. On the contrary, the exemplary embodiments are intended to cover alternatives, modifications and equivalents, which are included in the spirit and scope of the invention as defined by the appended claims. Further, in the detailed description of the exemplary embodiments, numerous specific details are set forth in order to provide a comprehensive understanding of the claimed invention. However, one skilled in the art would understand that various embodiments may be practiced without such specific details.

Although the features and elements of the present exemplary embodiments are described in the embodiments in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

What is claimed is:

1. A metal organic chemical vapor deposition system, comprising:
    a reaction chamber defined by a tube;
    a protective tube enclosing the tube;
    a first heater arranged inside the tube, on a first side of the reaction chamber;
    a second heater arranged outside the tube and within an annulus formed between the tube and the protective tube, on a second side of the reaction chamber, which is opposite to the first side; and
    a controller configured to selectively control an amount of heat applied by the second heater to the reaction chamber depending on a type of vapor deposition being performed in the reaction chamber,
    wherein the second heater is configured to move in the annulus formed between the tube and the protective tube.

2. The metal organic chemical vapor deposition system of claim 1, wherein the first heater and second heaters are inductive heaters, the system further comprising:
    a radio frequency coil surrounding the first heater, the second heater, and the reaction chamber, wherein the controller is configured to control movement of the moveable second heater.

3. The metal organic chemical vapor deposition system of claim 2, further comprising:
    a motor coupled to the controller and the moveable second heater, wherein the motor moves the moveable second heater.

4. The metal organic chemical vapor deposition system of claim 2, wherein the first heater and the moveable second heater are comprised of carbon.

5. The metal organic chemical vapor deposition system of claim 2, wherein the reaction chamber comprises:
    the tube having a top portion and a bottom portion, wherein the first heater is fixed in the bottom portion of the tube and the moveable second heater is arranged above the top portion of the tube.

6. The metal organic chemical vapor deposition system of claim 5, wherein the first heater is configured to heat the bottom portion of the tube and the moveable second heater is configured to heat the top portion of the tube.

7. The metal organic chemical vapor deposition system of claim 2, wherein the first heater and the moveable second heater are inductively heated by pulsing of the radio frequency coil.

8. The metal organic chemical vapor deposition system of claim 1, wherein the second heater enhances thermal decomposition of molecules in the reaction chamber by changing a flow of the molecules in the reaction chamber.

9. A method of operating a metal organic chemical vapor deposition system, the method comprising:
    heating a reaction chamber, which is defined by a tube, by using a first heater arranged inside the tube, on a first side of the reaction chamber, during a first type of vapor deposition;
    determining that a second type of vapor deposition will be performed in the reaction chamber;
    heating the reaction chamber using the first heater and a second heater, which is located outside the tube and within an annulus formed between the tube and a protective tube that encloses the tube, and is arranged on a second side of the reaction chamber, responsive to the determination that the second type of vapor deposition will be perform in the reaction chamber and while the second type of vapor deposition is performed; and
    moving the second heater in the annulus formed between the tube and the protective tube.

10. The method of claim 9, wherein the first heater is a fixed heater, the second heater is a moveable heater, the first fixed heater and the second moveable heater are inductive heaters activated by a radio frequency coil.

11. The method of claim 9, wherein the first and second types of vapor depositions involve different compositions of semiconductor vapors.

12. The method of claim 11, wherein the first and second types of vapor deposition involve nitride semiconductor vapor and the second type of vapor deposition further involves indium vapor.

13. The method of claim 9, wherein the heating of the second heater enhances thermal decomposition of molecules in the reaction chamber by changing a flow of the molecules in the reaction chamber.

14. A method of operating a metal organic chemical vapor deposition system, the method comprising:
    heating, during a first period of time, a reaction chamber, which is defined by a tube, of the metal organic chemical vapor deposition system using a first heater while a first type of semiconductor vapor is supplied to the reaction chamber, wherein a protective tube encloses the tube;
    adjusting, subsequent to the first period of time, an amount of heat supplied to the reaction chamber by a second heater to a first amount of heat, wherein the second heater is arranged outside the tube and within an annulus formed between the tube and the protective tube;
    heating, during a second period of time and while the second heater is generating the first amount of heat, the reaction chamber using the first and second heaters while a second type of semiconductor vapor is supplied to the reaction chamber;
    adjusting, subsequent to the second period of time, an amount of heat supplied to the reaction chamber by the second heater to a second amount of heat;
    heating, during a third period of time and while the second heater is generating the second amount of heat, the reaction chamber while a third type of semiconductor vapor is supplied to the reaction chamber; and
    moving the second heater in the annulus formed between the tube and the protective tube,
    wherein the first heater is located inside the tube.

15. The method of claim 14, wherein the second amount of heat is no heat.

16. The method of claim 14, wherein the first and second heaters are inductive heaters and a position of the second heater to the reaction chamber is adjusted to adjust the amount of heat supplied to the reaction chamber by the second heater.

17. The method of claim 14, wherein the first and third types of semiconductor vapors are gallium nitride (GaN) or aluminum gallium nitride (AlGaN) semiconductor vapors and the second type of semiconductor vapor is indium gallium nitride (InGaN), indium aluminum nitride (InAlN), or indium aluminum gallium nitride (InAlGaN) semiconductor vapor.

* * * * *